United States Patent
Rao et al.

(10) Patent No.: US 7,361,567 B2
(45) Date of Patent: Apr. 22, 2008

(54) NON-VOLATILE NANOCRYSTAL MEMORY AND METHOD THEREFOR

(75) Inventors: Rajesh A. Rao, Austin, TX (US); Ramachandran Muralidhar, Austin, TX (US); Bruce E. White, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 159 days.

(21) Appl. No.: 11/043,826

(22) Filed: Jan. 26, 2005

(65) Prior Publication Data

US 2006/0166452 A1  Jul. 27, 2006

(51) Int. Cl.
H01L 21/331 (2006.01)
H01L 21/20 (2006.01)
H01L 21/8242 (2006.01)
H01L 21/31 (2006.01)
H01L 21/469 (2006.01)

(52) U.S. Cl. .................. 438/369; 438/257; 438/637; 438/775

(58) Field of Classification Search ................ 438/369, 438/637, 257, 478, 503
See application file for complete search history.

(56) References Cited

U.S. PATENT DOCUMENTS

| | | | |
|---|---|---|---|
| 6,297,095 B1 | 10/2001 | Muralidhar | |
| 6,320,784 B1 | 11/2001 | Muralidhar | |
| 6,413,819 B1 | 7/2002 | Zafar | |
| 6,444,545 B1 | 9/2002 | Sadd | |
| 6,713,127 B2 | 3/2004 | Subramony | |
| 2006/0166493 A1* | 7/2006 | Lim et al. ................. | 438/637 |

OTHER PUBLICATIONS

Lai, "Tunnel Oxide and ETOX™ Flash Scaling Limitation," IEEE 1998 Int'l Nonvolatile Memory Technology Conference, pp. 6-7.
Cavins et al., "A Nitride-Oxide Blocking Layer for Scaled SONOS Non-Volatile Memory," *Motorola, Inc.*, Jan. 10, 2002, 3 pages.

* cited by examiner

*Primary Examiner*—Chuong A. Luu
(74) *Attorney, Agent, or Firm*—James L. Clingan, Jr.; Daniel D. Hill

(57) ABSTRACT

A nanocrystal non-volatile memory (NVM) has a dielectric between the control gate and the nanocrystals that has a nitrogen content sufficient to reduce the locations in the dielectric where electrons can be trapped. This is achieved by grading the nitrogen concentration. The concentration of nitrogen is highest near the nanocrystals where the concentration of electron/hole traps tend to be the highest and is reduced toward the control gate where the concentration of electron/hole traps is lower. This has been found to have the beneficial effect of reducing the number of locations where charge can be trapped.

20 Claims, 2 Drawing Sheets

NON-VOLATILE NANOCRYSTAL MEMORY AND METHOD THEREFOR

RELATED APPLICATION

This application is related to U.S. application Ser. No. 11/043,827 by Sangwoo Lim, et al., titled "SEMICONDUCTOR DEVICE HAVING NITRIDATED OXIDE LAYER AND METHOD THEREFOR," filed on even date herewith, and assigned to the assignee hereof.

FIELD OF THE INVENTION

The present invention relates to non-volatile memories having nanocrystals for storage, and more particularly to the insulation of and over such nanocrystals.

RELATED ART

Nanocrystal memories have been found to be advantageous over floating gate memories due to increased immunity to charge leakage through gate dielectric defects. One issue in nanocrystal memories is the potential for electron trapping in the dielectric stack under the control gate. This problem occurs during hot carrier injection of electrons into the nanocrystals. A fraction of the electrons not trapped by the nanocrystals can be trapped in the dielectric stack, which leads to a shift in the threshold voltage. These electrons trapped in the dielectric stack are not electrically erasable so they accumulate with repeated program and erase cycles. Thus the shift in threshold voltage continues to grow with the repeated program erase operations and requires circuit designs that attempt to mitigate this effect. In addition to this, dielectric trapped charge can lead to degradation in reliability due to internal electric fields working concomitantly with external bias. For example, electrons trapped in the portion of the dielectric stack between the control gate and the nanocrystals can degrade data retention of nanocrystals programmed with electrons by accelerating tunneling loss through the portion of the dielectric stack between the nanocrystals and the substrate.

Thus, there is a need for a method and structure that alleviates and/or reduces one or more of these problems.

BRIEF DESCRIPTION OF THE DRAWINGS

The present invention is illustrated by way of example and not limited by the accompanying figures, in which like references indicate similar elements, and in which.

DETAILED DESCRIPTION OF THE DRAWINGS

In one aspect, a nanocrystal non-volatile memory (NVM) has a dielectric between the control gate and the nanocrystals that has a nitrogen content sufficient to reduce the locations in the dielectric where electrons can be trapped. This is achieved by grading the nitrogen concentration. The concentration of nitrogen is highest near the nanocrystals where the concentration of electron/hole traps tend to be the highest and is reduced toward the control gate where the concentration of electron/hole traps is lower. This has been found to have the beneficial effect of reducing the number of locations where charge can be trapped. This is better understood with reference to the drawings and the following description.

Figure 1:
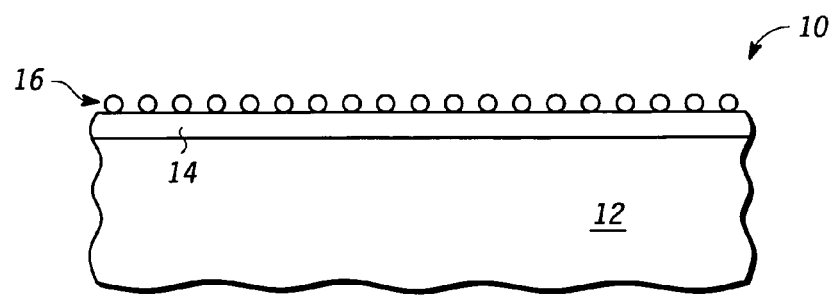
FIG. 1 is a cross section of a device structure at a stage in processing according to an embodiment of the invention.

Shown in FIG. 1 is a semiconductor device 10 comprising a substrate 12, a gate dielectric 14 over substrate 12, a plurality of nanocrystals 16 over the gate dielectric 14. Substrate 12 is preferably a bulk silicon substrate but could be an SOI substrate also and could be a different semiconductor material than silicon. Gate dielectric layer 14 is preferably a grown oxide that is 50 to 100 Angstroms in thickness and has a graded nitrogen content which is highest farthest from nanocrystals 16 and closest to substrate 12. Nanocrystals 16 in this example are made of silicon and have a density of between five times ten to the eleventh (5e11) and 1.2e12 per centimeter squared. Nanocrystals 16 vary in size between about 3 to 10 nanometers. Nanocrystals 16 are preferably deposited by chemical deposition, but other processes may also be used. Other processes for forming nanocrystals include recrystallization of a thin amorphous layer of silicon and the deposition of prefabricated nanocrystals. Subsequent to nanocrystal formation, nanocrystals 16 may be passivated by oxidizing them using nitrous oxide.

Figure 2:
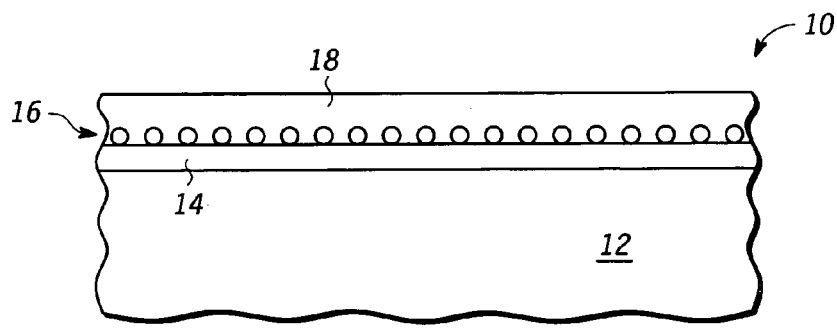
FIG. 2 is a cross section of the device structure of FIG. 1 at a subsequent stage in processing.

Shown in FIG. 2 is semiconductor device 10 after forming a nitride-doped oxide layer 18 over and around nanocrystals 16. It is preferably about 3 to five nanometers in thickness and forms a first portion of a dielectric between the nanocrystals and a control gate that is not yet formed. The nitrogen content in layer 18 is graded. The highest nitrogen content is closest to the nanocrystals and begins at about 5-10 atomic percent. The nitrogen content is reduced away from nanocrystals 16 to eventually less than about 2 atomic percent. This grading is preferably achieved by reacting small amounts of ammonia with oxide forming gases such as dichlorosilane and nitrous oxide and gradually decreasing the flow rate of the ammonia. An alternative is to implant nitrogen into an oxide layer in a series of implant steps. The heaviest dose implant is with the highest energy and the lightest dose implant is with the lowest energy. This implantation is preferably performed in a remote plasma environment to prevent damage to layer 18. The nitrogen in the oxide layer during subsequent annealing steps saturates dangling bonds in the originally formed oxide layer. In particular silicon-hydrogen bonds that have weak immunity to hot electrons are converted to more robust silicon-nitrogen bonds. Since the highest concentration of such bond defects is at the interface between dielectric layers, in this case between layers 14 and 18, and between the nanocrystals 16 and dielectric layer 18, a higher concentration of nitrogen is needed in these interface regions. Further away from the interface, the bond defects are fewer and require less nitrogen. Excessive nitrogen in these areas is deleterious to the memory device by acting as electron/hole traps. Additionally, oxygen can be implanted into layer 18 to aid in densification.

Figure 3:
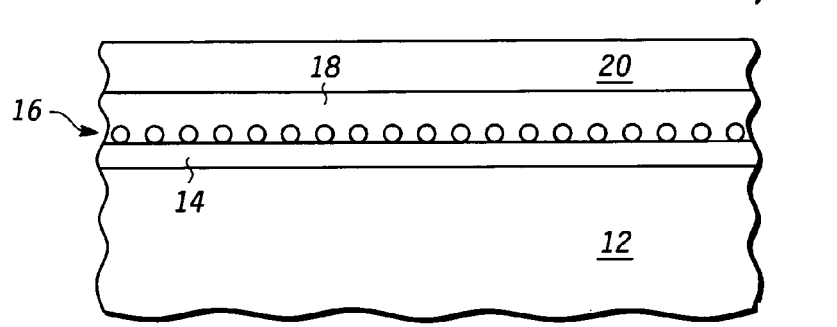
FIG. 3 is a cross section of the device structure of FIG. 2 at a subsequent stage in processing.

Shown in FIG. 3 is semiconductor device 10 after forming a dielectric layer 20 over layer 18. Dielectric layer 20 is preferably silicon oxide and deposited by reacting a silicon-containing precursor such as silane or dichlorosilane with an oxidizer such as oxygen or nitrous oxide in a chemical vapor deposition chamber at between about 500 and 900 degrees Celsius. Layer 20 is typically between four and ten nanometers in thickness.

Figure 4:
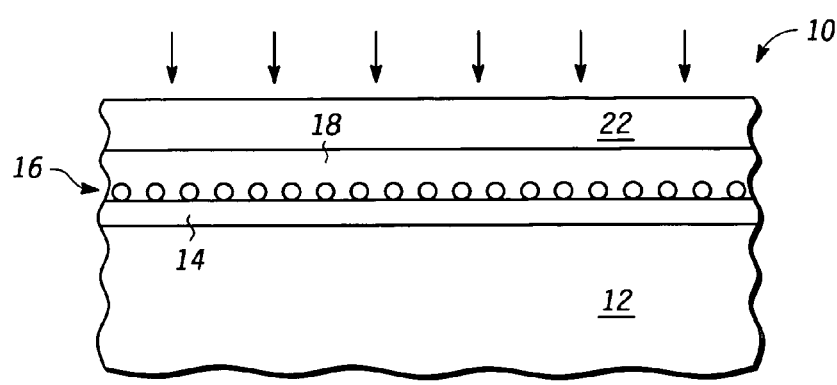
FIG. 4 is a cross section of the device structure of FIG. 3 at a subsequent stage in processing.

Shown in FIG. 4 is semiconductor device 10 after performing remote plasma nitridation of layer 20 to form a nitrided layer 22. The nitrogen content in nitrided layer 22 is preferably less than about 2 atomic percent. Since achieving such small nitrogen content is difficult by CVD, remote plasma deposition is the preferred approach. The energy of the remote plasma can be reduced over time in conjunction with a reduction in the flow of the nitrogen-containing species in order to achieve a graded nitrogen concentration in nitrided layer 22. The higher nitrogen concentration in such case is at the interface of layers 18 and 22 and the lower concentration is at the top surface of layer 22. Implanting nitrogen is also an alternative but remote plasma is preferable due to there being less damage at and near the surface of layer 20 compared to implanting. This remote plasma deposition, with enough energy, can also be utilized to introduce additional nitrogen into layer 18. Additionally, oxygen can be implanted into layer 20 to aid in densification.

After performing the nitridation, annealing steps are performed, preferably at about greater than 700 degrees Celsius or higher. A first of these annealing steps is done in an inert ambient such as nitrogen or argon at about greater than 800 degrees Celsius. This step facilitates nitrogen bonding and expels free hydrogen from layers 18 and 22. A second of these annealing steps is in a dilute oxidizing ambient and is for removing non-stoichiometric defects that may still be present. A third of these annealing steps is performed close to or about the glass transition temperature, which is about 950 degrees Celsius. The high degree of atomic motion during this reflow condition facilitates the structure to relax the stress of layers 18 and 22. The second and third annealing steps may be able to be combined into a single annealing step. The annealing temperature preferably does not exceed 1100 degrees Celsius.

Figure 5:
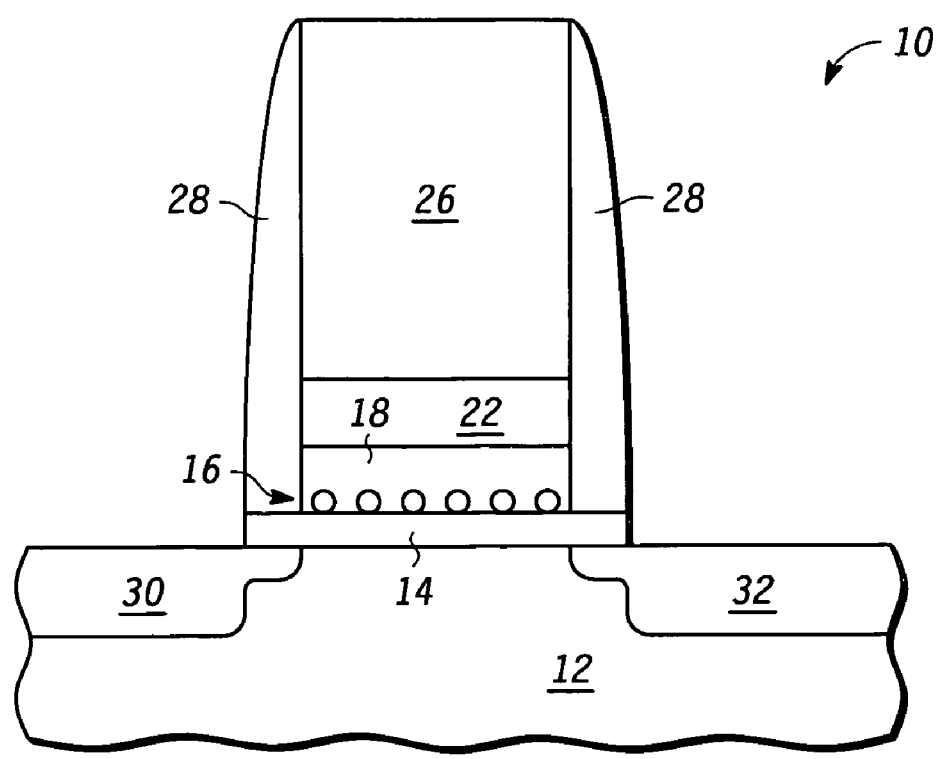
FIG. 5 is a cross section of the structure of FIG. 4 at a subsequent stage in processing; and Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

Shown in FIG. 5 is semiconductor device 10 after performing known steps to form an NVM device comprising a control gate 26, a sidewall spacer 28 around control gate 26, a source/drain region 30 on one side of control gate 26 and in substrate 12, and a source/drain region 32 on the other side of control gate 26 and in substrate 12. The resulting semiconductor device 10 of FIG. 5 is a transistor useful as the NVM device and for forming arrays of such devices. Layers 18 and 22 with their nitrogen content as described reduces threshold shift due to electron/hole trapping. Another benefit of the described approach is that layers 18 and 22 have increased density. Unlike thermally grown oxide such as layer 14, deposited oxides are less dense and stoichiometrically imperfect. This is typically seen in the significantly faster etch rates of deposited oxides compared to grown oxides. Annealing alone has little impact on increasing the density. The presence of atomic nitrogen and oxygen obtained by remote plasma implantation facilitates unsaturated bond completion due to higher reactivity and leads to a denser oxide and the consequent improvement in electrical characteristics such as breakdown field and hot carrier immunity.

In the foregoing specification, the invention has been described with reference to specific embodiments. However, one of ordinary skill in the art appreciates that various modifications and changes can be made without departing from the scope of the present invention as set forth in the claims below. For example, the gate dielectric layer 14 was described as grown oxide but could instead be a deposited high k dielectric. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
    providing a semiconductor substrate;
    forming a first insulating layer over a surface of the semiconductor substrate;
    forming a layer of nanocrystals over a surface of the first insulating layer; and
    forming a second insulating layer having a graded nitrogen content over the layer of nanocrystals.

2. The method of claim 1, further comprising forming a third insulating layer over the second insulating layer, wherein the third insulating layer has a relatively lower nitrogen content than the second insulating layer.

3. The method of claim 2, wherein forming the third insulating layer comprises forming the third insulating layer to have a nitrogen content that less than the lowest nitrogen content of the graded nitrogen content of the second insulating layer.

4. The method of claim 2, further comprising annealing the semiconductor device in an ambient comprising oxygen at a temperature of 700 to 1100 degrees Celsius.

5. The method of claim 2, wherein forming the third insulating layer further comprises uses plasma nitridation to modulate the nitrogen content of the third insulating layer.

6. The method of claim 5, wherein using plasma nitridation comprises reducing a plasma energy of the plasma nitridation source over time to form the graded nitrogen content.

7. The method of claim 5, wherein using plasma nitridation comprises reducing a flow of the nitrogen source over time to form the graded nitrogen content.

8. The method of claim 1, wherein forming the second insulating layer comprising forming the second insulating layer using silicon-oxynitride.

9. The method of claim 1, wherein forming the second insulating layer comprises forming the second insulating layer having a peak nitrogen content of about two atomic percent to about ten atomic percent.

10. The method of claim 1, wherein forming the second insulating layer further comprises using plasma nitridation to modulate the nitrogen content of the second insulating layer.

11. The method of claim 10, wherein using plasma nitridation comprises reducing a plasma energy of the plasma nitridation source over time to form the graded nitrogen content.

12. The method of claim 10, wherein using plasma nitridation comprises reducing a flow of the nitrogen source over time to form the graded nitrogen content.

13. The method of claim 1, wherein forming the second insulating layer further comprises using chemical vapor deposition by flowing gases comprising silicon, an oxidation source, and a nitrogen source.

14. The method of claim 13, wherein forming the second insulating layer further comprises reducing a flow of the nitrogen source over time to form the graded nitrogen content.

15. The method of claim 1, wherein forming the first insulating layer comprises forming the first insulating layer having a nitrogen content that decreases as distance from the semiconductor substrate increases.

16. The method of claim 1, wherein forming the second insulating layer comprises having relatively more nitrogen at an interface with the layer of nanocrystals and relatively less nitrogen as distance from the layer of nanocrystals increases.

17. The method of claim 1, wherein the nanocrystals of the layer of nanocrystals comprises at least one of silicon, germanium, or a metal.

18. The method of claim 1, further comprising coating the nanocrystals with a material comprising nitrogen.

19. The method of claim 1, wherein forming the first insulating layer comprises forming the first insulating layer from an oxide comprising at least one of silicon, hafnium, lanthanum, and aluminum.

20. The method of claim 1, wherein forming the second insulating layer further comprises using plasma oxidation to improve the stoichiometry of the second insulating layer.

* * * * *